United States Patent
Yang

(10) Patent No.: US 11,372,291 B2
(45) Date of Patent: Jun. 28, 2022

(54) MANUFACTURING METHOD OF ARRAY SUBSTRATE, ARRAY SUBSTRATE AND LIQUID CRYSTAL DISPLAY PANEL

(71) Applicants: HKC Corporation Limited, Shenzhen (CN); Chongqing HKC Optoelectronics Technology Co., ltd., Chongqing (CN)

(72) Inventor: ChunHui Yang, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 113 days.

(21) Appl. No.: 16/772,907

(22) PCT Filed: Sep. 11, 2018

(86) PCT No.: PCT/CN2018/105061
§ 371 (c)(1),
(2) Date: Jun. 15, 2020

(87) PCT Pub. No.: WO2019/119888
PCT Pub. Date: Jun. 27, 2019

(65) Prior Publication Data
US 2021/0373393 A1    Dec. 2, 2021

(30) Foreign Application Priority Data
Dec. 21, 2017 (CN) .......................... 201711392946.7

(51) Int. Cl.
*G02F 1/1362* (2006.01)
*G02F 1/1368* (2006.01)

(52) U.S. Cl.
CPC ...... *G02F 1/136209* (2013.01); *G02F 1/1368* (2013.01); *G02F 1/136222* (2021.01); *G02F 1/136286* (2013.01)

(58) Field of Classification Search
CPC ......... G02F 1/136209; G02F 1/136222; G02F 1/136286; G02F 1/1368; G02F 1/136218
See application file for complete search history.

(56) References Cited

U.S. PATENT DOCUMENTS

2015/0014709 A1*  1/2015  Kim .................. G02F 1/133502
257/88

FOREIGN PATENT DOCUMENTS

CN       101825814 A     9/2010
CN       104280926 A     1/2015
(Continued)

*Primary Examiner* — James A Dudek
(74) *Attorney, Agent, or Firm* — WPAT, PC

(57) ABSTRACT

A manufacturing method of an array substrate is provided, including steps: forming a light shield layer and a first metal layer on a transparent base to locate the light shield layer between the transparent base and the first metal layer and identify a pattern of the light shield layer and a pattern of the first metal layer, forming an insulating layer, a passageway layer and an ohmic contact layer sequentially on the first metal layer, forming a second metal layer on the ohmic contact layer, forming a passivation layer on the second metal layer and forming a contact hole in the passivation layer, and forming a pixel electrode layer on the passivation layer to allow the pixel electrode layer to connect the second metal layer through the contact hole. Moreover, an array substrate and a liquid crystal display panel are further provided.

6 Claims, 5 Drawing Sheets

(56) References Cited

FOREIGN PATENT DOCUMENTS

CN 105842904 A 8/2016
CN 10713271 9/2017

\* cited by examiner

MANUFACTURING METHOD OF ARRAY SUBSTRATE, ARRAY SUBSTRATE AND LIQUID CRYSTAL DISPLAY PANEL

FIELD OF THE DISCLOSURE

The disclosure relates to a display technical field, and more particularly to a manufacturing method of an array substrate, an array substrate and a liquid crystal display panel.

BACKGROUND

An exemplary liquid crystal display includes an array substrate and a color filter substrate. In the manufacturing process, the array substrate includes five processes of M1/AS/M2/PV/ITO with five masks, and the color filter substrate includes five processes of BM/R/G/B/PS with five masks. The function of the black matrix of the color filter substrate is to block light leaked due to the liquid crystal direction chaos caused by disordered electric field adjacent to data lines and gate lines.

But in practical manufacturing process, especially when the liquid crystal display panel are aligned, the black matrix and the data line can easily dislocated, resulting in light leakage on the side of the data line to severely affect the qualified rate of products. In the exemplary technology, the width of the black matrix on the color filter substrate can be raised to reduce the possibility of leaking light, resulting in an effect of preventing light leakage to some extent but the transmittance is significantly degraded.

SUMMARY

An embodiment of the disclosure provides a manufacturing method of an array substrate, an array substrate and a liquid crystal display panel for enhancing the display effect of the liquid crystal display device and the qualified rate of products.

The disclosure provides a manufacturing method of an array substrate, including steps: forming a light shield layer and a first metal layer on a transparent base to locate the light shield layer between the transparent base and the first metal layer and identify a pattern of the light shield layer and a pattern of the first metal layer, forming an insulating layer, a passageway layer and an ohmic contact layer sequentially on the first metal layer, forming a second metal layer on the ohmic contact layer, forming a passivation layer on the second metal layer and forming a contact hole in the passivation layer; and forming a pixel electrode layer on the passivation layer to allow the pixel electrode layer to connect the second metal layer through the contact hole.

In an embodiment of the disclosure, forming the light shield layer and the first metal layer on the transparent base to locate the light shield layer between the transparent base and the first metal layer and identify the pattern of the light shield layer and the pattern of the first metal layer includes: forming a black shield material layer on the transparent base, forming a first metal material layer on the black shield material layer, forming a photoresist material layer on the first metal material layer, exposing and developing the photoresist material layer by a mask to obtain a patterned photoresist material layer, processing the first metal material layer and the black shield material layer sequentially by a wet etching and a dry etching with the patterned photoresist material layer as the mask, and removing a residual photoresist material layer after the dry etching to obtain the light shield layer and the first metal layer.

In an embodiment of the disclosure, a material of the light shield layer is a black photoresist containing carbon black.

In an embodiment of the disclosure, the light shield layer and the first metal layer are formed in an identical mask process.

In an embodiment of the disclosure, the first metal layer includes a scan line, a common electrode and a gate electrode of a thin film transistor.

In an embodiment of the disclosure, the ohmic contact layer includes a first region and a second region separated from each other on the passageway layer.

In an embodiment of the disclosure, the second metal layer includes a source electrode of a thin film transistor, a drain electrode of the thin film transistor and a data line; the data line is connected to the source electrode; the drain electrode is connected to the pixel electrode layer through the contact hole; the source electrode is connected to the first region of the ohmic contact layer, and the drain electrode is connected to the second region of the ohmic contact layer.

In an embodiment of the disclosure, the transparent base is made out of glass, quartz or organic polymer.

An embodiment of the disclosure further provides an array substrate, including: a transparent base, a light shield layer disposed on the transparent base, a first metal layer disposed on the light shield layer, an insulating layer disposed on the first metal layer, a passageway layer disposed on the insulating layer, an ohmic contact layer disposed on the passageway layer, a second metal layer disposed on the ohmic contact layer, a passivation layer disposed on the second metal layer and formed with a contact hole, and a pixel electrode layer disposed on the passivation layer and connected to the second metal layer through contact hole. The light shield layer is located between the transparent base and the first metal layer, and a pattern of the light shield layer and a pattern of the first metal layer are identical.

In an embodiment of the disclosure, a material of the light shield layer is a black photoresist containing carbon black.

In an embodiment of the disclosure, the first metal layer includes a scan line, a common electrode and a gate electrode of a thin film transistor.

In an embodiment of the disclosure, the second metal layer includes a source electrode of a thin film transistor, a drain electrode of the thin film transistor and a data line. The data line is connected to the source electrode, and the drain electrode is connected to the pixel electrode layer through the contact hole.

In an embodiment of the disclosure, the first metal layer and the light shield layer are immediately contacted.

An embodiment of the disclosure further provides a liquid crystal display panel, including: an array substrate, a color filter substrate disposed opposite to the array substrate and a liquid crystal layer disposed between the array substrate and the color filter substrate. The color filter substrate includes a black matrix layer.

The array substrate includes: a transparent base, a light shield layer disposed on the transparent base, a first metal layer disposed on the light shield layer, an insulating layer disposed on the first metal layer, a passageway layer disposed on the insulating layer, an ohmic contact layer disposed on the passageway layer, a second metal layer disposed on the ohmic contact layer, a passivation layer disposed on the second metal layer and formed with a contact hole, a pixel electrode layer disposed on the passivation layer and connected to the second metal layer through contact hole, a color filter substrate disposed opposite to the array substrate, and a liquid crystal layer, disposed between the array substrate and the color filter substrate. The light shield layer is located between the transparent base and the first metal layer, and a pattern of the light shield layer and a pattern of the first metal layer are identical.

In an embodiment of the disclosure, a material of the light shield layer is a black photoresist containing carbon black.

In an embodiment of the disclosure, the first metal layer includes a scan line, a common electrode and a gate electrode of a thin film transistor.

In an embodiment of the disclosure, the second metal layer includes a source electrode of a thin film transistor, a drain electrode of the thin film transistor and a data line. The data line is connected to the source electrode, and the drain electrode is connected to the pixel electrode layer through the contact hole.

In an embodiment of the disclosure, the first metal layer and the light shield layer are immediately contacted.

In an embodiment of the disclosure, a material of the light shield layer on the array substrate and a material of the black matrix layer on the color filter substrate are identical.

In an embodiment of the disclosure, the transparent base can be made out of glass, quartz or organic polymer.

Disposing the light shield layer between the transparent base and the first metal layer on the array substrate in the disclosure overcomes the light leaked on the side of the data lines and the common electrode caused by the alignment dislocation problem when the array substrate and the color filter substrate are aligned to improve the display effect of the liquid crystal display panel and the qualified rate of liquid crystal display panels.

BRIEF DESCRIPTION OF THE DRAWINGS

In order to more clearly illustrate technical solutions in embodiments of the disclosure, the drawings required in description of the embodiments will be briefly introduced. Apparently, the described drawings below are just some embodiments of the disclosure, and a person skilled in the art can obtain other drawings according to these drawings without any inventive work.

DETAILED DESCRIPTION OF PREFERRED EMBODIMENTS

Technical solutions in embodiments of the disclosure will be described clearly with reference to the accompanying drawings in the embodiments of the disclosure as follows. Apparently, the described embodiments are merely some embodiments of the disclosure rather than all of the embodiments. Based on the embodiments in the disclosure, all other embodiments obtained by a person skilled in the art without any creativity should belong to the protective scope of the disclosure.

Figure 1A:
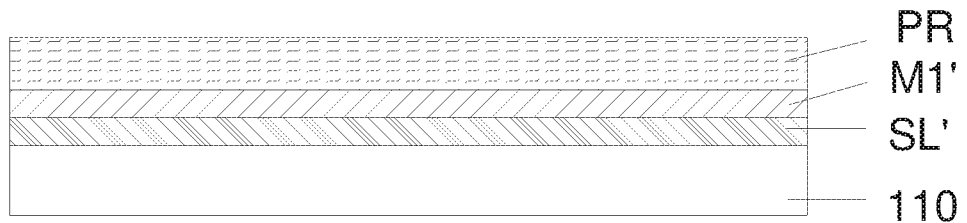
FIGS. 1a-1j are cross-sectional views of a manufacturing process of an array substrate according to an embodiment of the disclosure.

As shown from FIG. 1a to FIG. 1j, an embodiment of the disclosure provides a manufacturing method of an array substrate 100, specifically including:

(a) as shown in FIGS. 1a-1f, forming a light shield layer SL and a first metal layer M1 on a transparent base 110 to locate the light shield layer SL between the transparent base 110 and the first metal layer M1. Optionally, the light shield layer SL and the first metal layer M1 are immediately contacted. The light shield layer SL and the first metal layer M1 are formed in one mask M to identify a pattern of the light shield layer SL and a pattern of the first metal layer M1, specifically including:

(a1) forming a black shield material layer SL' on the transparent base 110, then forming a first metal material layer M1' on the black shield material layer SL', subsequently forming a photoresist layer PR on the first metal material layer M1', as shown in FIG. 1a.

Figure 1B:
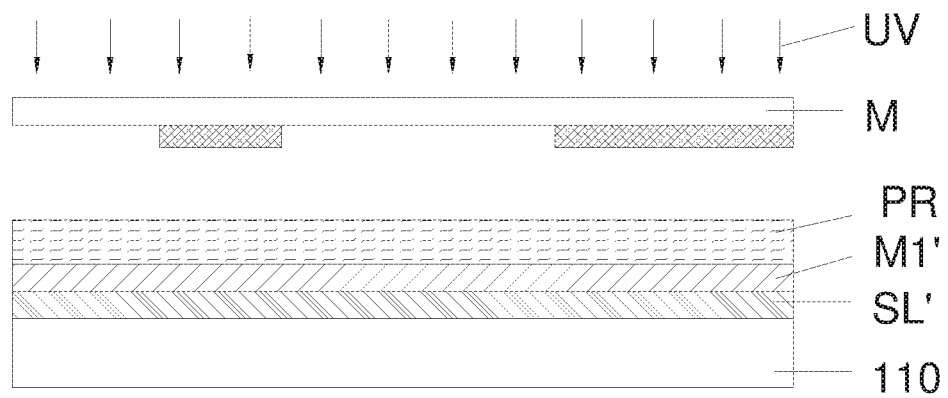
Figure 1C:
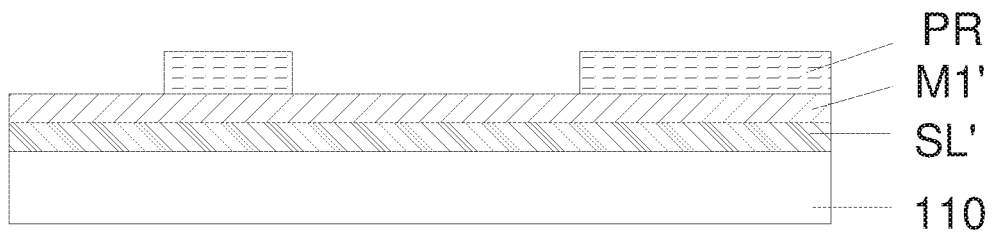

(a2) As shown in FIG. 1b, the photoresist layer PR is exposed and developed by using the mask M to obtain the patterned photoresist layer PR. The mask M is engraved with a certain pattern. The photoresist layer PR is exposed by using ultraviolet UV penetrating the mask M, and the pattern in the mask M is trans-printed onto the photoresist layer PR. The photoresist layer PR is sprayed by the developer, and the photoresist material exposed under the UV is dissolved in the developer to obtain the patterned photoresist layer PR, as shown in FIG. 1c.

Figure 1D:
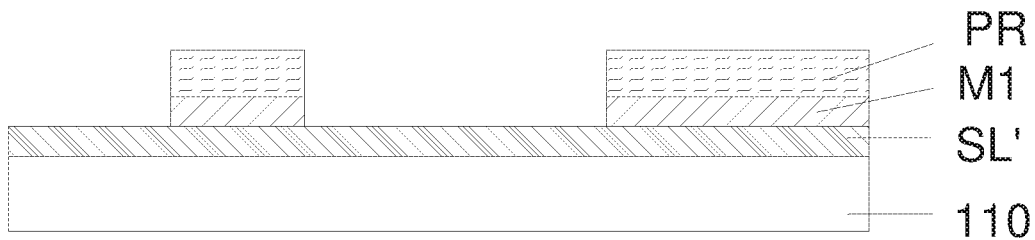
Figure 1E:
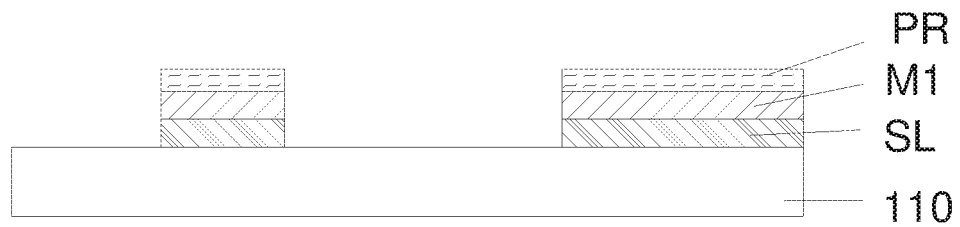

(a3) The first metal material layer M1' and the black shield material layer SL' are sequentially processed by wet etching and dry etching with the patterned photoresist layer PR as the mask, as shown in FIG. 1d and FIG. 1e.

Figure 1F:
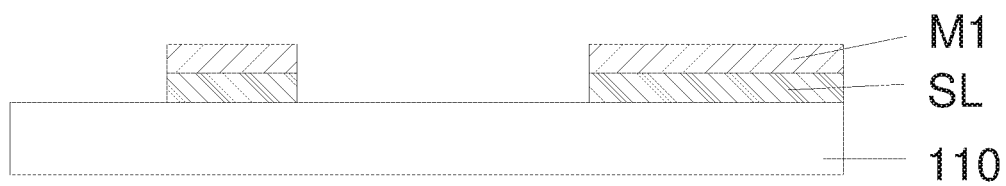

(a4) The residual photoresist layer PR is removed after dry etching to obtain the light shield layer SL and the first metal layer M1, as shown in FIG. 1f.

Figure 1G:
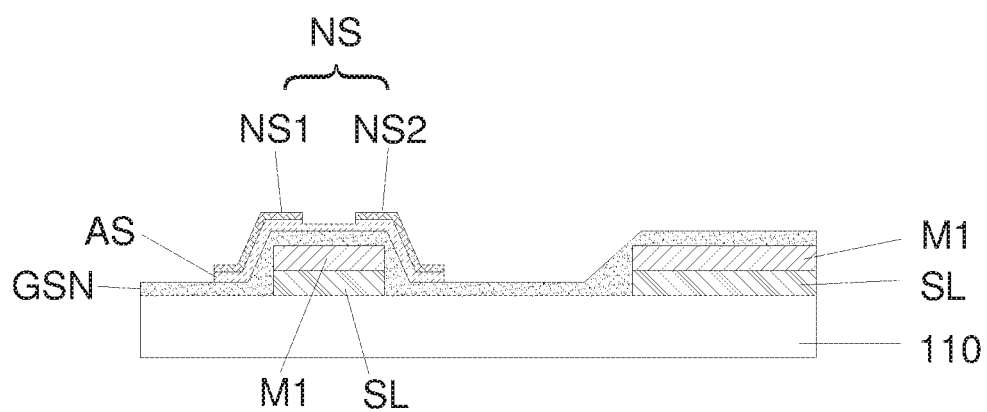

(b) An insulating layer GSN, a passageway layer AS and an ohmic contact layer NS. The ohmic contact layer NS includes a first region NS1 and a second region NS2, as shown in FIG. 1g.

Figure 1H:
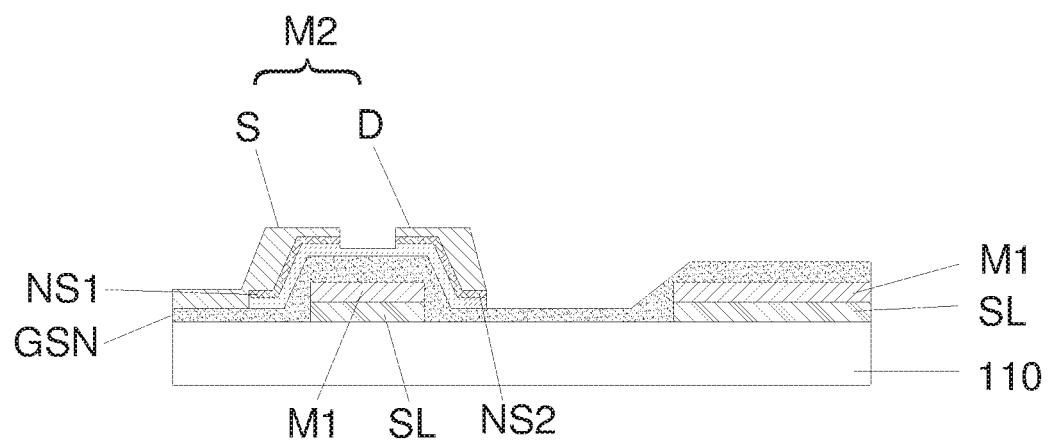

(h) As shown in FIG. 1h, the ohmic contact layer NS is formed with a second metal layer M2. The second metal layer M2 includes a source electrode S of the thin film transistor, a drain electrode D of the thin film transistor and a data line 150 (not shown in FIG. 1h). The data line 150 is connected to the source electrode S; the source electrode S is connected to the first region NS1 of the first ohmic contact layer NS; the drain electrode D is connected to the second region NS2 of the ohmic contact layer NS.

Figure 1I:
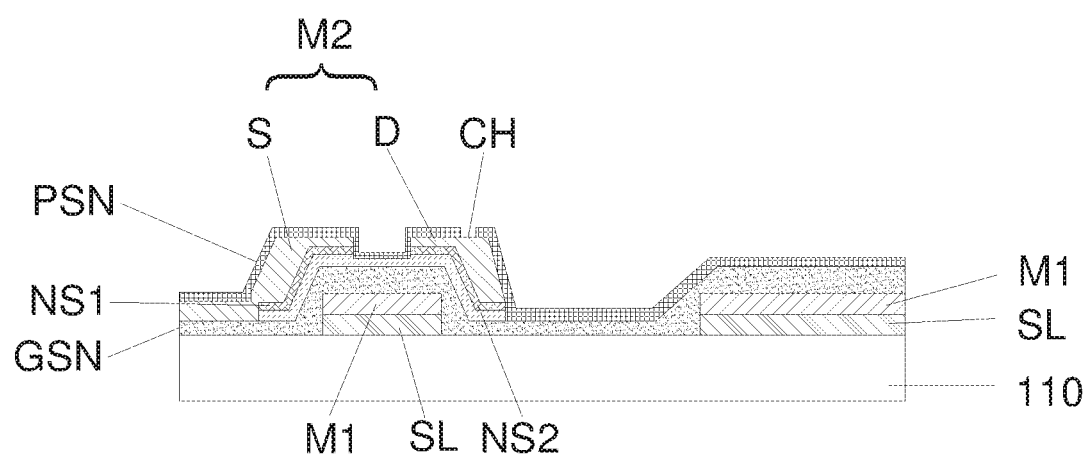

(i) The second metal layer M2 is formed with a passivation layer PSN and the passivation layer PSN is formed with a contact hole CH, as shown in FIG. 1i.

Figure 1J:
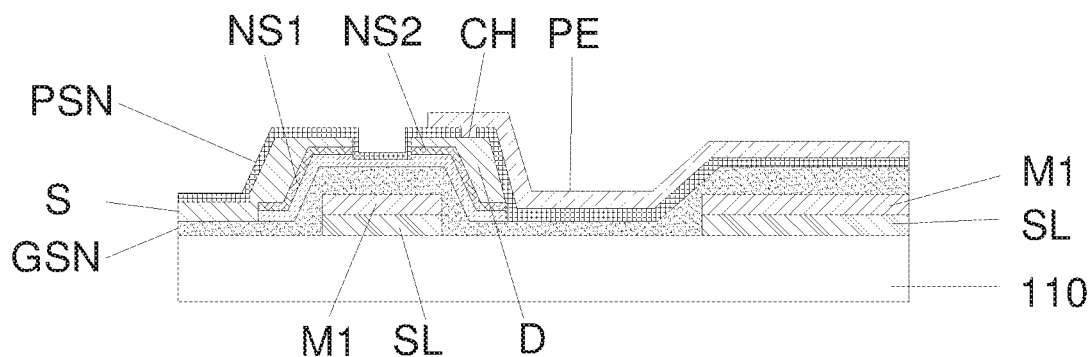

(j) As shown in FIG. 1j, the passivation layer PSN is formed with a pixel electrode layer PE. The pixel electrode layer PE is connected to the drain electrode D of the thin film transistor through the contact hole CH of the passivation layer PSN. And the array substrate is prepared.

Overall, the light shield layer is added before the first metal layer of the array substrate in the embodiment, and one photoresist layer with the same pattern is utilized as the mask to sequentially process the first metal layer by wet etching and dry etching to achieve the light shield layer and the first metal layer to share the mask and simplify the manufacturing process, as well as reducing the manufacturing cost.

Figure 2:
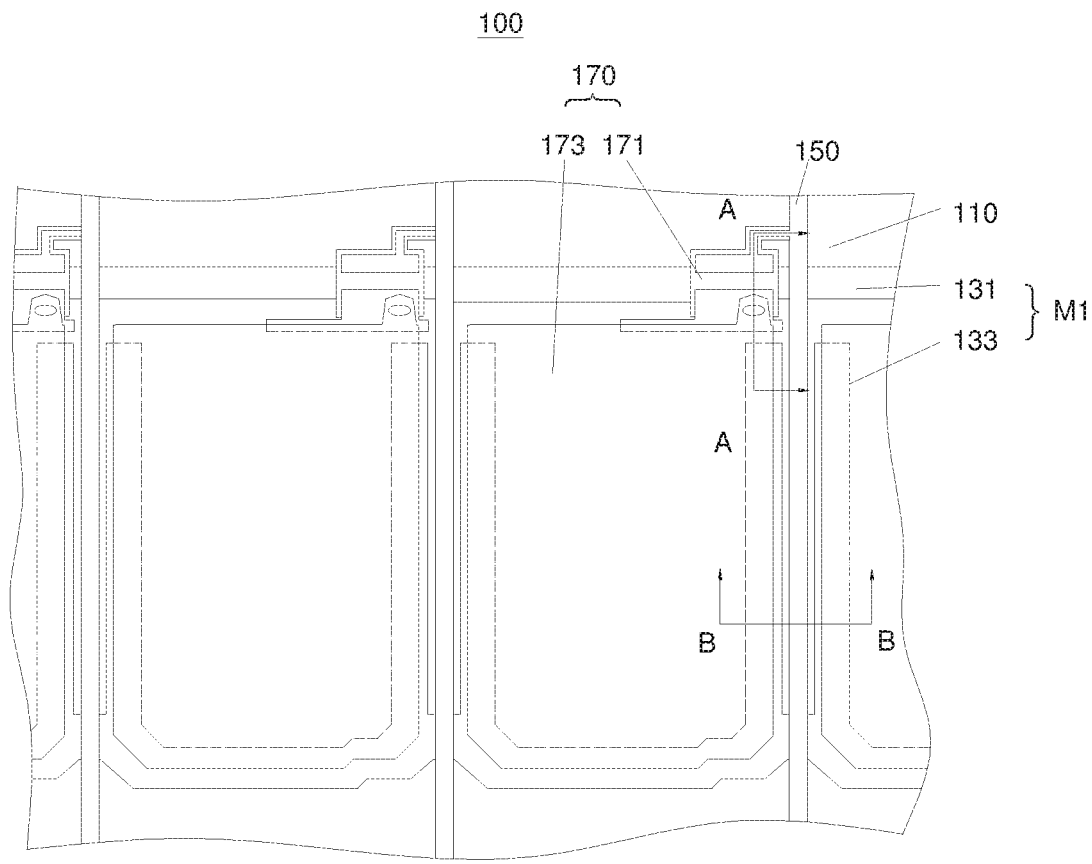
FIG. 2 is a structural schematic view of an array substrate according to another embodiment of the disclosure.
Figure 3:
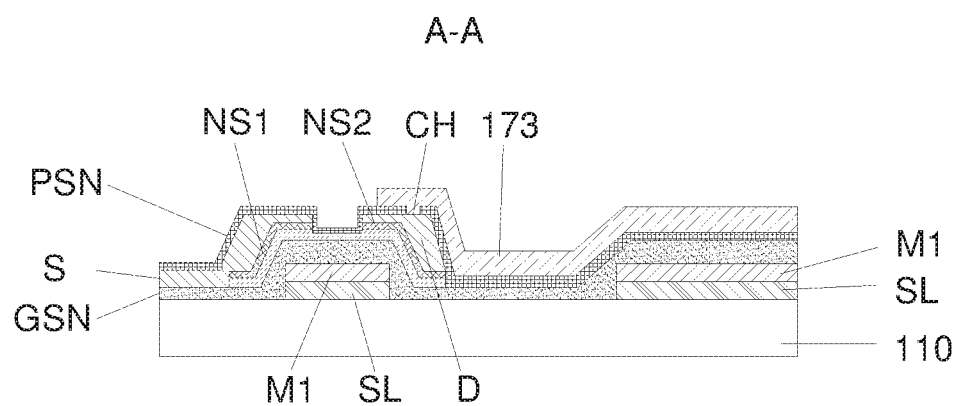
FIG. 3 is a cross-sectional schematic view of the array substrate taken along a line A in FIG. 1.
Figure 4:
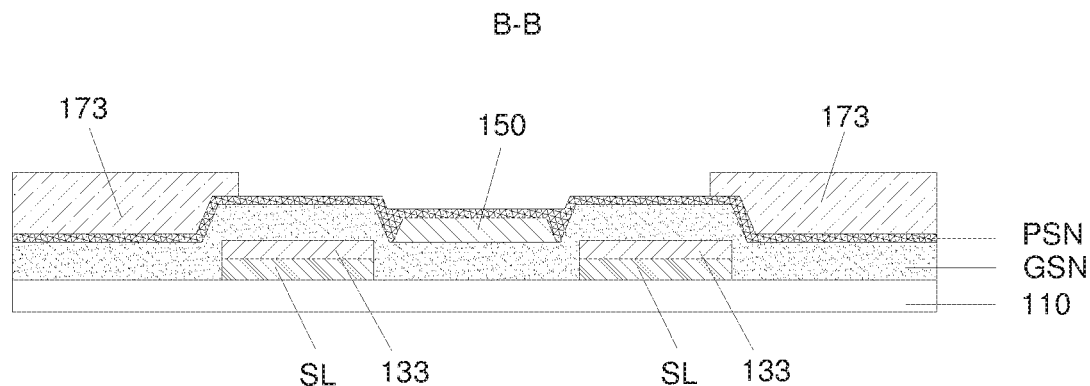
FIG. 4 is a cross-sectional schematic view of the array substrate taken along a line B in FIG. 1.

As shown in FIG. 2, FIG. 3 and FIG. 4, another embodiment of the disclosure provides an array substrate 100, including the transparent base 110, the light shield layer SL, the first metal layer M1, the insulating layer GSN, the passageway layer AS, the ohmic contact layer NS, the second metal layer M2, the passivation layer PSN and the pixel electrode layer PE. The light shield layer SL is disposed on the transparent base 110, and sequentially disposed with the first metal layer M1, the insulating layer GSN, the passageway layer AS, the ohmic contact layer NS, the second metal layer M2, and the passivation layer PSN. The passivation layer PSN is formed with the contact hole CH. The pixel electrode layer PE is disposed on the passivation layer PSN and connected to the second metal layer M2 through the contact hole CH.

Specifically, the transparent base 110 can be made out of glass, quartz, organic polymer or other adaptable materials. The material of the light shield layer SL can be an opaque material such as the black photoresist containing carbon black with the function of blocking light. Optionally, the pattern of the light shield layer SL and the pattern of the first metal layer M1 are identical, namely shapes and sizes of the light shield layer SL and first metal layer M1 are completely the same.

The first metal layer M1 can be a conductive layer, and the material can be molybdenum, aluminum, copper, titanium, wolfram and the like. The first metal layer M1 includes a scan line 131 and a common electrode 133. The second metal layer M2 includes the data line 150. The scan line 131 and the data line 150 primarily are configured to transfer and motivate driving signals of all pixels 170 on the array substrate 100. The extension direction of the scan line 131 and the extension direction of the data line 150 are different; the extension direction of the scan line 131 is optionally perpendicular to the extension direction of the data line 150, namely the scan line 131 and the data line 150 are arranged to be mutually vertical and crisscross. Scan lines 131 and data lines 150 are crisscross to form staggered regions distributed as an array, and one of the staggered regions is named as a pixel 170 for the purpose of illustration herein.

As shown in FIG. 3, each of the pixels 170 is disposed with a thin film transistor 171 and a pixel electrode 173. The thin film transistor 171 includes the gate electrode G, the insulating layer GSN, the passageway layer AS, the ohmic contact layer NS, the source electrode S, the drain electrode D and the passivation layer PSN.

Specifically, the first metal layer M1 further includes the gate electrode G of the thin film transistor 171. The gate electrode G is connected to the scan lines 131. The insulating layer GSN is located on/above the gate electrode G; the passageway layer AS is located on/above the insulating layer GSN and corresponding to the gate electrode G. The ohmic contact layer NS includes the first region NS1 and the second region NS2 mutually separated on the passageway layer AS. The second metal layer M2 further includes the source electrode S of the thin film transistor 171 and the drain electrode D of the thin film transistor 171. The source electrode S and the drain electrode D are located above the passageway layer AS, and the source electrode S is connected to the data line 150. The source electrode S is connected to the first region NS1 of the ohmic contact layer NS; the drain electrode D is connected to the second region NS2 of the ohmic contact layer. The passivation layer PSN covers the source electrode S, the drain electrode D and the data line 150, and the contact hole is formed correspondingly to the drain electrode D for connecting the drain electrode D and the pixel electrode 173. The material of the pixel electrode 173 can be a transparent oxide material such as indium tin oxide (ITO).

As shown in FIG. 4, the common electrode 133 is disposed on the light shield layer SL and shown as a U shape, and three sides are surrounded by the pixel electrode 173 but without any contact therebetween due to the insulating layer GSN and the passivation layer PSN as the separation. The projection of the common electrode 133 on the transparent base 110 is partially overlapped with the projection of the pixel electrode 173 on the transparent base 110 to form the storage capacitance between the common electrode 133 and the pixel electrode 173.

In summary, the light shield layer between the transparent base and the first metal layer on the array substrate of the embodiment is configured to overcome the light leakage problem caused by dislocation of the black matrix on the color filter substrate and the data lines on the array substrate in the cell process of the array substrate and the color filter substrate, resulting in improving the display effect of liquid crystal display devices and the qualified rate of liquid crystal display devices.

Figure 5:
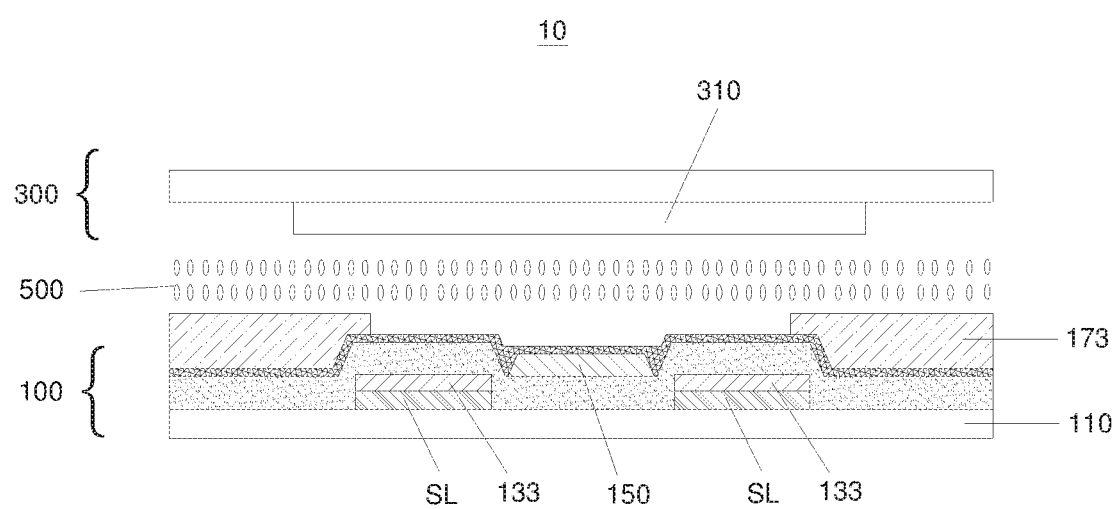
FIG. 5 is a structural schematic view of a liquid crystal display panel according to still another embodiment of the disclosure.

As shown in FIG. 5, another embodiment of the disclosure provides a liquid crystal display panel 10, including: the array substrate 100, a color filter substrate 300, and a liquid crystal layer 500. The array substrate 100 and the color filter substrate 300 are disposed opposite. The liquid crystal layer 500 is disposed between the array substrate 100 and the color filter substrate 300.

The array substrate 100 is the array substrate described in the embodiments above, configured to transmit and control electric signals.

The color filter substrate 300 is configured to display colors. The color filter substrate 300 includes a black matrix 310. The material of the black matrix 310 can be a material such as the black photoresist containing carbon black, configured to absorb and block light. Optionally, the material of the black matrix 310 and the material of the light shield layer SL in the array substrate 100 are the same, and in the manufacturing process, extra materials are unnecessary, resulting in reducing the manufacturing cost of liquid crystal display devices.

The fulfillment and technical effects of the display device 10 can be referred to the manufacturing method of an array substrate in the embodiments above, without further repeat herein.

In the embodiments provided by the disclosure, comprehensively, the disclosed system, device and method can be fulfilled in other manners. For instance, the device in the embodiments above purely is exemplary, for instance, the component division merely is a logic functional division, and other divisions can be provided in practice, such as the components or elements can be combined or integrated in another system, or some features can be skipped, or unexecuted. Additionally, the displayed or discussed mutual coupling or direct coupling, or communication connection can be indirect coupling or communication connection by some ports, devices or elements, electrically, mechanically or in other forms.

The individually illustrated components can be separated in physical or not, and the components as unit display can be a physical component or not, namely located on one position, or distributed on networks. The objective of the embodiments can be fulfilled by selecting some or all of the components according to the practical requirement.

The final declaration is the embodiments above purely are for illustrating the technical solutions of the disclosure rather than any limitation; even though the disclosure has been illustrated in detail with reference to the aforementioned embodiments, a person skilled in the art can understand the technical solutions recorded in the embodiments above can be modified, or some of the features can be replaced; but the modification or replacement will not lead to the essence of the corresponding technical solution to be excluded from the spirit and scope of the technical solutions of the embodiments of the disclosure.

What is claimed is:

1. A liquid crystal display panel comprising:
an array substrate, comprising:
a transparent base;
a light shield layer, disposed on the transparent base;
a first metal layer, disposed on the light shield layer; wherein the light shield layer is located between the transparent base and the first metal layer and a pattern of the light shield layer and a pattern of the first metal layer are identical;
an insulating layer, disposed on the first metal layer;
a passageway layer, disposed on the insulating layer;
an ohmic contact layer, disposed on the passageway layer;
a second metal layer, disposed on the ohmic contact layer;
a passivation layer, disposed on the second metal layer and formed with a contact hole;
a pixel electrode layer, disposed on the passivation layer and connected to the second metal layer through the contact hole;
a color filter substrate, disposed opposite to the array substrate, wherein the color filter substrate comprises a black matrix layer; and
a liquid crystal layer, disposed between the array substrate and the color filter substrate;
wherein the first metal layer comprises a scan line, a common electrode, and a gate electrode of a thin film transistor;
wherein the second metal layer comprises a source electrode of the thin film transistor, a drain electrode of the thin film transistor and a data line, the data line is connected to the source electrode, and the drain electrode is connected to the pixel electrode layer through the contact hole;
wherein viewed from a cross-sectional view taken along a direction (B-B) perpendicular to the data line, the black matrix layer completely covers the common electrode located at two opposite sides of the data line, the light shield layer located at the two opposite sides of the data line, and the data line and further covers partial areas of the pixel electrode layer located at the two opposite sides of the data line.

2. The liquid crystal display panel according to claim 1, wherein a material of the light shield layer is a black photoresist containing carbon black.

3. The liquid crystal display panel according to claim 1, wherein the first metal layer and the light shield layer are immediately contacted.

4. The liquid crystal display panel according to claim 1, wherein a material of the light shield layer on the array substrate and a material of the black matrix layer on the color filter substrate are identical.

5. The liquid crystal display panel according to claim 1, wherein the transparent base is made out of glass, quartz or organic polymer.

6. The liquid crystal display panel according to claim 1, wherein viewed from the cross-sectional view taken along the direction (B-B) perpendicular to the data line, projections of the common electrode located at two opposite sides of the data line on the transparent base are non-overlapped with a projection of the data line on the transparent base, and projections of the light shield layer located at two opposite sides of the data line on the transparent base are non-overlapped with the projection of the data line.

* * * * *